United States Patent
Chanemougame et al.

(10) Patent No.: US 11,646,318 B2
(45) Date of Patent: May 9, 2023

(54) CONNECTIONS FROM BURIED INTERCONNECTS TO DEVICE TERMINALS IN MULTIPLE STACKED DEVICES STRUCTURES

(71) Applicant: Tokyo Electron Limited, Tokyo (JP)

(72) Inventors: Daniel Chanemougame, Niskayuna, NY (US); Lars Liebmann, Mechanicsville, NY (US); Jeffrey Smith, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/326,449

(22) Filed: May 21, 2021

(65) Prior Publication Data

US 2022/0102380 A1 Mar. 31, 2022

Related U.S. Application Data

(60) Provisional application No. 63/085,583, filed on Sep. 30, 2020.

(51) Int. Cl.
*H01L 27/12* (2006.01)
*H01L 23/528* (2006.01)
*H01L 21/84* (2006.01)
*H01L 23/535* (2006.01)
*H01L 21/74* (2006.01)

(52) U.S. Cl.
CPC ........ *H01L 27/1203* (2013.01); *H01L 21/743* (2013.01); *H01L 21/84* (2013.01); *H01L 23/528* (2013.01); *H01L 23/535* (2013.01)

(58) Field of Classification Search
CPC ... H01L 27/1203; H01L 21/743; H01L 21/84; H01L 23/528; H01L 23/535; H01L 9/78696; H01L 29/42392
USPC .......................................... 257/401; 438/284
See application file for complete search history.

(56) References Cited

U.S. PATENT DOCUMENTS

| | | | |
|---|---|---|---|
| 10,586,765 | B2 | 3/2020 | Smith et al. |
| 10,833,078 | B2 | 11/2020 | Smith et al. |
| 10,861,852 | B2 | 12/2020 | Li et al. |
| 2018/0374791 | A1 | 12/2018 | Smith et al. |
| 2019/0172828 | A1 | 6/2019 | Smith et al. |
| 2020/0135718 | A1* | 4/2020 | Liebmann ........... H01L 27/1203 |
| 2020/0144264 | A1 | 5/2020 | Li et al. |
| 2020/0219804 | A1 | 7/2020 | Jezewski et al. |
| 2021/0028169 | A1 | 1/2021 | Smith et al. |

OTHER PUBLICATIONS

International Search Report and Written Opinion dated Nov. 11, 2021 in PCT/US2021/042474, 9 pages.

* cited by examiner

*Primary Examiner* — Thinh T Nguyen
(74) *Attorney, Agent, or Firm* — Oblon, McClelland, Maier & Neustadt, L.L.P.

(57) ABSTRACT

In vertically stacked device structures, a buried interconnect and bottom contacts can be formed, thereby allowing connections to be made to device terminals from both below and above the stacked device structures. Techniques herein include a structure that enables electrical access to each independent device terminal of multiple devices, stacked on top of each other, without interfering with other devices and the local connections that are needed.

7 Claims, 15 Drawing Sheets

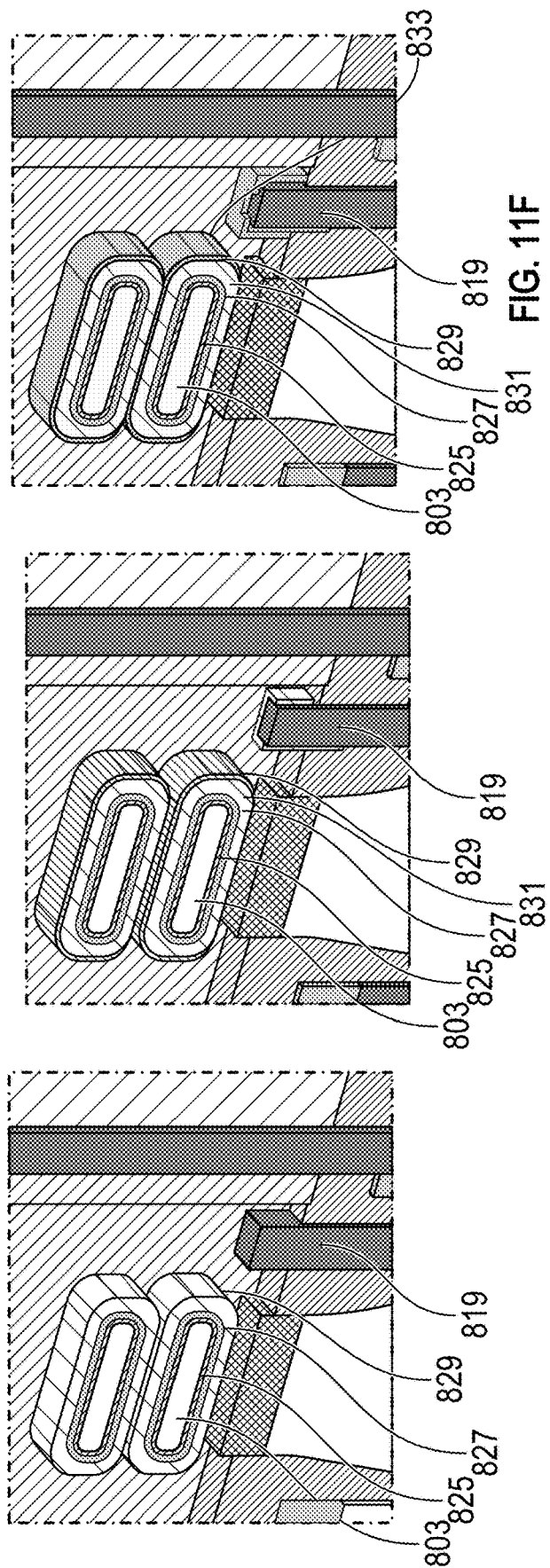

CONNECTIONS FROM BURIED INTERCONNECTS TO DEVICE TERMINALS IN MULTIPLE STACKED DEVICES STRUCTURES

CROSS REFERENCE TO APPLICATION

This application claims priority to U.S. Provisional Patent Application No. 63/085,583 filed Sep. 30, 2020, the contents of which are incorporated herein by reference.

FIELD OF THE INVENTION

The disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

One challenge of using 3D semiconductor circuits is having the capability to electrically isolate and access the gate of each device in the vertical stack. This access is critical to enable full functionality of transistor circuits with maximum 3D efficiency. Interconnects are usually formed above the vertical stack, therefore making access to the gates of devices at the bottom of the stack particularly challenging.

SUMMARY

The present disclosure is directed to a semiconductor device comprising: a stack of device tiers having at least three device tiers including a lower device tier, one or more intermediate device tiers stacked vertically over the lower device tier, and an upper device tier stacked vertically over the intermediate device tiers, each device tier having at least one lateral gate-all-around channel of a field effect transistor; a first interconnect line positioned below the stack of device tiers; a second interconnect line positioned above the stack of device tiers; a bottom contact that connects the first interconnect line to one or more first device terminals from the stack of device tiers; and a top contact that connects the second interconnect line to one or more second device terminals from the stack of device tiers.

In one embodiment, the one or more first device terminals is a lower device terminal in the lower device tier.

In one embodiment, the one or more first devices terminals and the one or more second device terminals is a gate.

In one embodiment, the one or more second device terminals is at least one of an upper device terminal in the upper device tier and an intermediate device terminal in the one or more intermediate device tiers.

In one embodiment, in a case that the one or more second device terminals includes the intermediate device terminal, the intermediate device terminal is laterally extended beyond a length of (1) the upper device terminal and (2) any additional intermediate device terminals from the one or more intermediate device tiers located above the intermediate device terminal to connect the top contact to the intermediate device terminal without contacting the additional intermediate device terminals nor the upper device terminal.

In one embodiment, at least one of vertically adjacent device tiers in the stack of device tiers shares a common device terminal.

One embodiment further comprises insulation material located between and electrically separating device terminals of at least one pair of vertically adjacent device tiers in the stack of device tiers.

One embodiment further comprises a power rail positioned to provide power to the stack of device tiers.

In one embodiment, the one or more first device terminals and the one or more second device terminals is at least one of a source and drain.

The present disclosure is also directed to a method of forming a semiconductor device, the method comprising: forming a stack of nano-channels spaced vertically from each other; forming a first interconnect line positioned below the stack of nano-channels; creating a bottom contact that connects to the first interconnect line; forming gate-all-around channels from the stack of nano-channels, wherein the gate-all-around channels form a stack of device tiers having at least three device tiers including a lower device tier, one or more intermediate device tiers stacked vertically over the lower device tier, and an upper device tier stacked vertically over the one or more intermediate device tiers; connecting the first interconnect line to one or more first device terminals from the stack of device tiers using the bottom contact; and connecting a second interconnect line to one or more second device terminals from the stack of device tiers using a top contact, the second interconnect line formed above the stack of device tiers.

In one embodiment, the one or more first device terminals is a lower device terminal in the lower device tier.

In one embodiment, the one or more first device terminals and the one or more second device terminals is a gate.

In one embodiment, the one or more second device terminals is at least one of an upper device terminal in the upper device tier and an intermediate device terminal in the one or more intermediate device tiers.

One embodiment further comprises, in a case that the one or more second device terminals includes the intermediate device terminal, laterally extending the intermediate device terminal beyond a length of (1) the upper device terminal and (2) any additional intermediate device terminals from the one or more intermediate device tiers located above the intermediate device terminal to connect the top contact to the intermediate device terminal without contacting the additional intermediate device terminals nor the upper device terminal.

One embodiment further comprises forming a power rail positioned to provide power to the stack of device tiers.

In one embodiment, the creating the bottom contact includes forming a pattern of the bottom contact, filling the pattern with sacrificial material, and replacing the sacrificial material with metal.

In one embodiment, the forming the first interconnect includes forming a pattern of the first interconnect, filling the pattern with sacrificial material, and replacing the sacrificial material with metal.

In one embodiment, the one or more first device terminals and the one or more second device terminals is at least one of a source and drain.

In one embodiment, at least one of vertically adjacent device tiers in the stack of device tiers shares a common device terminal.

One embodiment further comprises electrically separating device terminals of at least one of vertically adjacent device tiers in the stack of device tiers using insulation material.

BRIEF DESCRIPTION OF DRAWINGS

FIG. 11D shows a zoomed in view during metal 1 formation, according to one embodiment of the present disclosure.

FIG. 11E shows a zoomed in view during metal 2 formation, according to one embodiment of the present disclosure.

FIG. 11F shows a zoomed in view during metal 3 formation, according to one embodiment of the present disclosure.

DETAILED DESCRIPTION

Figure 1B:
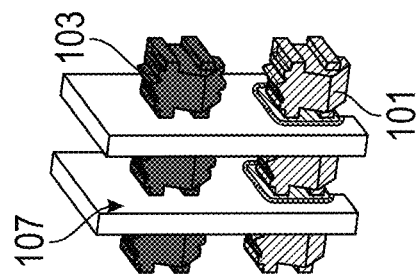
FIG. 1B shows an example of an NMOS connected together with a PMOS using a vertical common gate (i.e. a CFET), according to one embodiment of the present disclosure.
Figure 1A:
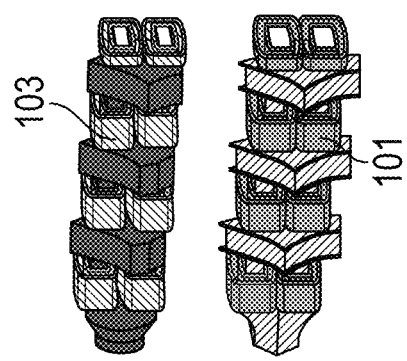
FIG. 1A shows an example of an N-type metal oxide semiconductor transistor (NMOS) connected together with a P-type metal oxide semiconductor transistor (PMOS) using a horizontal common gate, according to one embodiment of the present disclosure.
Figure 1A:
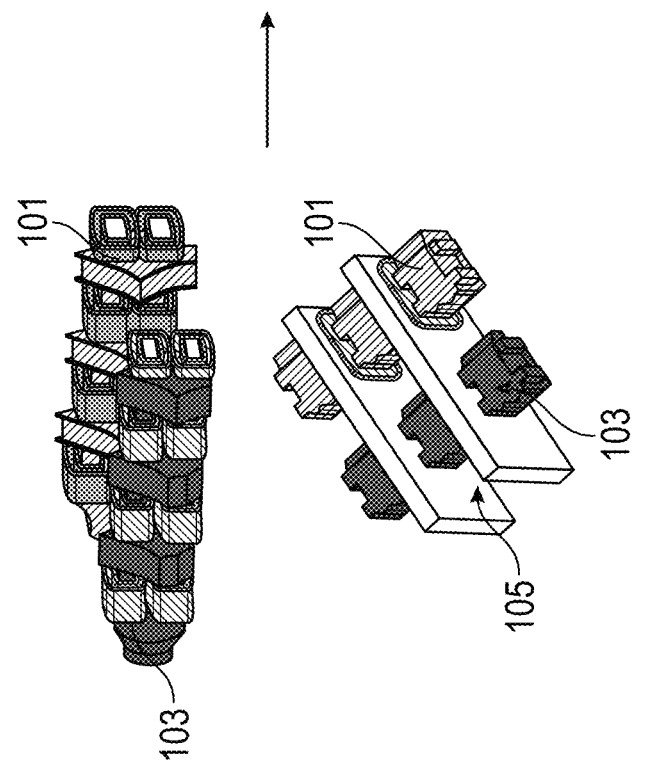

As the semiconductor industry transitions to a new device architecture, from finFET to lateral gate-all-around nano-sheet (LGAA NS), there is a significant research focus on the complementary FET device architecture, or CFET. In conventional technology, that is, planar bulk and finFET, NMOS 103 and PMOS 101 are built and arranged side-by-side on the same plane of the silicon wafer with a horizontal common gate 105, as shown in FIG. 1A. As shown in FIG. 1B, CFET takes advantage of the vertical dimension by stacking the NMOS 103 on top of the PMOS 101 (or vice versa). A vertical common gate 107 between the NMOS 103 and PMOS 101 replaces the horizontal common gate 105 running from the NMOS 103 side to the PMOS 101 side to make the complementary functions of CMOS. This physical arrangement takes advantage of the vertical dimension to provide better power, performance and area (PPA) scaling. The CFET architecture considered herein is based on, but not limited to, the LGAA NS device architecture, which is nano-sheet (i.e. nano-channel) stacked on nano-sheet (instead of finFET stacked on finFET).

Figure 2:
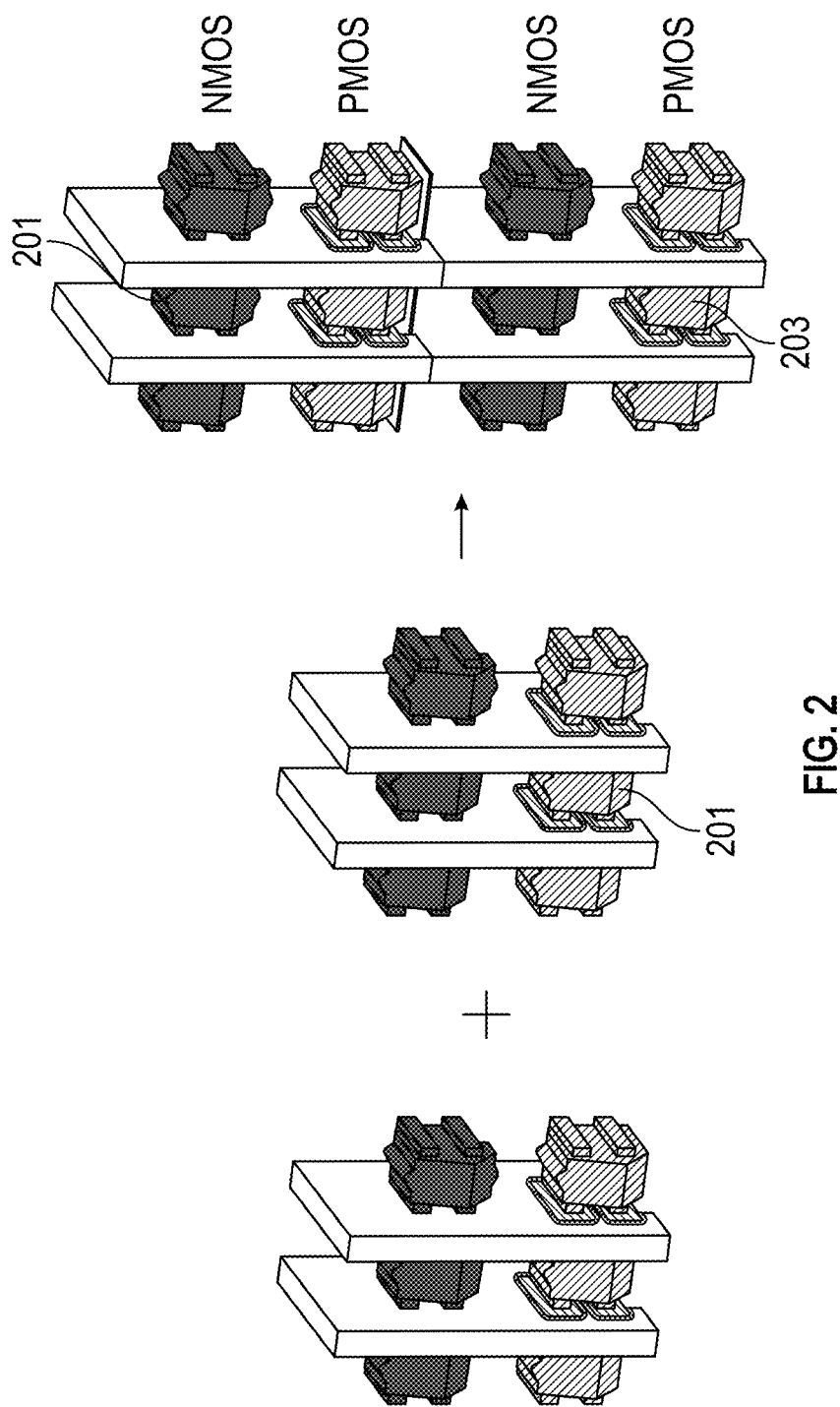
FIG. 2 shows an example of complementary field effect transistor (CFET) on CFET stacking, according to one embodiment of the present disclosure.

This disclosure is related to vertically stacking CFETs to offer compact 3D circuits that can lead to fundamental changes in the way circuits are designed. FIG. 2 shows a simplified representation of CFET 201 on CFET 203 stacking. Some details can be seen, such as the order of the tacked transistors (PMOS/NMOS/PMOS/NMOS from bottom to top), or the vertical gates being common to all the stacked devices. But such details are obviously very flexible and therefore highlight the very high number of combinations that 3D opens up.

As previously mentioned, stacking CFETs vertically presents challenges. One particular challenge is having the capability to electrically isolate and access the gate of each device in the stack. In such a complex stack, as described in FIG. 2, getting access to devices at the bottom of the stack (e.g. PMOS of CFET 203) is a challenge. This is because connections are conventionally made from the top of the stack.

The use case presented herein, for multiple layers of active devices stacked on top of each other, is naturally more challenging. Techniques herein, however, provide a unique structural solution with multiple associated methods. Techniques herein include a structure that enables electrical access independently to each gate of multiple devices, stacked on top of each other, without interfering with other devices and the local connections that are needed. In particular, structures herein provide access to the lowest device of the stack, which can be the most challenging to access in many instances. Techniques herein solve this problem by leveraging the vertical dimension to enable full functionality of CMOS circuits. This design furthers the pursuit of highly efficient, 3D stacked and integrated structures, thereby improving power, performance and area. In one embodiment, a structural conductor element is provided that the multiple device stack can conveniently connect to vertically.

The ability to electrically access the gates of the different device tiers, and to independently access to some extent, is beneficial to enable efficient 3D designs. Techniques herein enable stacking CFET on top of CFET with very dense designs. The discussions herein will primarily discuss using bottom gate contacts and top gate contacts to connect to gates, but it should be understood that these techniques can also be applied to make connections between top contacts and bottom contacts to other device terminals, such as the source and drain (e.g. bottom source contacts, top source contacts, bottom drain contacts, top drain contacts).

Figure 3A:
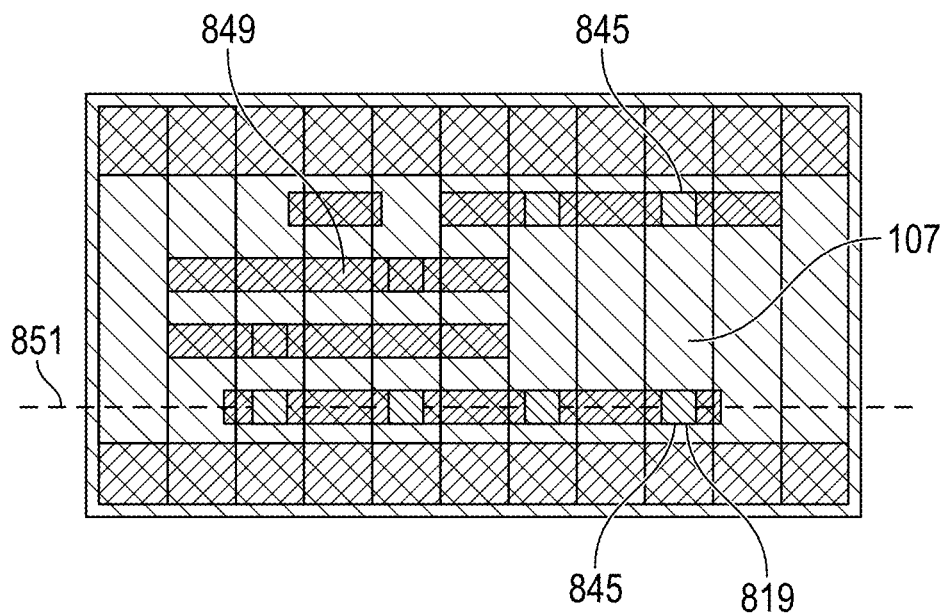
FIG. 3A shows a layout view of a circuit having gate connections to a first interconnect line below a stack of devices using a bottom gate connect, and a second interconnect line above the stack of devices using a top gate contact, according to one embodiment of the present disclosure.
Figure 3B:
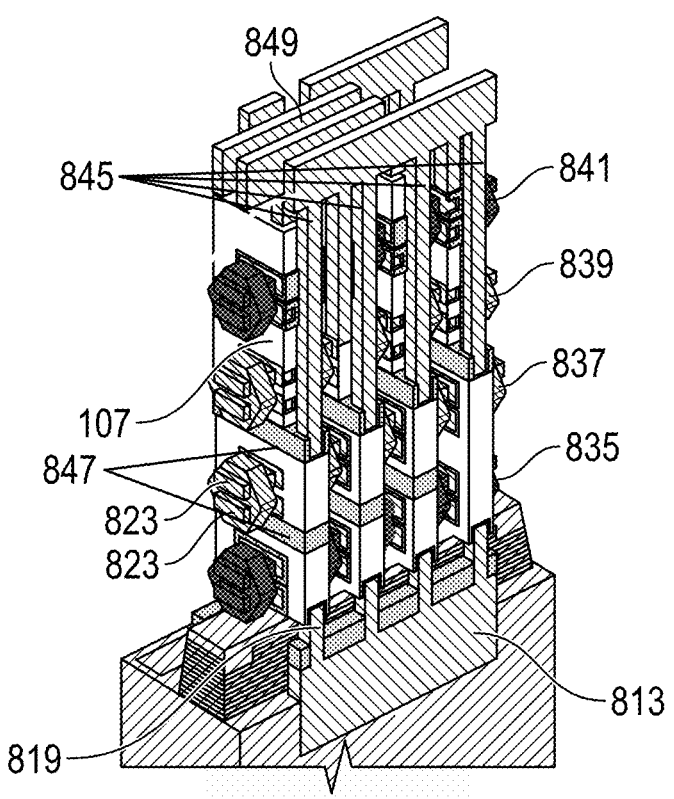
FIG. 3B shows perspective view of the circuit in FIG. 3A, according to one embodiment of the present disclosure.

FIG. 3A and FIG. 3B show a logic circuit made with four stacked levels of transistors incorporating techniques described herein. FIG. 3A shows a simplified top down view, or layout representation of that circuit. FIG. 3B shows a simplified 3D view of the 3D structure of that circuit, highlighting a central element of techniques herein, which is the bottom gate contact 819. Also shown are a first tier of devices 835, second tier of devices 837, third tiers of devices 839, fourth tier of devices 841, first interconnect line 813 connected to a gate of the first tier of devices 835 using the bottom gate contacts 819, and top gate contacts 845 connecting a second interconnect line 849 located above the tier of devices 835, 837, 839, 841 to various device gates in the second tier of devices 837, third tier of devices 839, and fourth tier of devices 841. Each device in the four tiers of devices 835, 837, 839, 841 are made of two gate-all-around channels 823, though more or less can be used in other embodiments.

As can be seen from the layout view in FIG. 3A, there are only four metal tracks available from the metal interconnect level on top of the structure (i.e. second interconnect line 849). This limited number is a direct result of the scaling trend impacting logic circuits. The number of tracks is a direct measure of the cell height, which has a direct impact on the cell area. Therefore reducing the cell height in conventional technology is done by reducing the number of tracks.

This cell compaction, however, creates additional challenges. This compaction makes it more difficult to provide all connectivity necessary to obtain a functional cell. Indeed, there are not enough metal tracks available to connect the devices together from the outside, as illustrated with the second interconnect line 849 in FIG. 3A and FIG. 3B. Typically, this vertical compaction would lead to a relaxation in the other direction (i.e. the width of the cell needs to grow to enable the connectivity needed). Unfortunately, increased cell width defeats the intent of density scaling.

On the layout view of FIG. 3A, the white squares represent the top gate contacts 845, which connect the devices to the outside through the second interconnect line 849. The dashed line 851 represents where the cross-section shown in FIG. 3B is located. As can be seen along the line 851, there are four squares representing bottom gate contacts 819. It is hard to represent on a 2D layout view, but there are also four squares representing top gate contacts 845 matching exactly the location of the four squares representing the bottom gate contacts 819 along the dashed line 851. The view on FIG. 3B illustrates how these two types of gate contacts are stacked on top of each other to complete the logic function of this particular circuit. On this particular cross-section, it can be seen that the top gate contacts 845 are used to connect the second interconnect line 849 to the gates of the second tier of devices 837. Note that alternatively this can instead connect with the gates of the third tier of devices 839 or the fourth tier of devices 841 (as can be seen in the background of FIG. 3B). The bottom gate contacts 819 are used to connect the gates of the first tier of devices 835 to a buried interconnect level, also referred to herein as the first interconnect line 813. This first interconnect line 813 is a buried metal interconnect line positioned below the tiers of devices 835, 837, 839, 841. Note that in one embodiment, the shape of certain device gates can be modified to offset a distance from one another to provide easier access for top and/or bottom gate contacts to make connections; such techniques will be discussed in more detailed herein below. The ability to connect the gates of the lowest device tier to a set of interconnects different from the conventional interconnect techniques is beneficial. This technique herein relaxes the density of connections that the conventional top interconnect has to provide and ultimately enables highly efficient and compact 3D designs.

While the first interconnect line 813 itself is beneficial in that it effectively provides a new layer of metal interconnects or extra tracks to complete the cell, providing a way herein to use this buried interconnect, that is, the bottom gate contact, is valuable. Although description of embodiments herein center around connecting the gate terminals of the first tier of devices 835 with bottom gate contact 819, it should be noted that the techniques herein also extend to connecting any device terminals of the first device tier as well. For example, the device terminal can be a source or drain connecting to the first interconnect line 813 through a bottom active contact similar to the bottom gate contact 819. Note also that examples herein feature a buried power rail and power wall; these features, however, are optional for embodiments herein.

Additionally, pairs of vertically adjacent gates can be electrically separated, or share a common terminal. For example, as can be seen in FIG. 3B, insulation material 847 is located between some gates of the first tier of devices 835 and second tier of devices 837, as well as between the gates of the second tier of devices 837 and third tier of devices 839, to provide electrical separation. Furthermore, gates of the third tier of devices 839 and fourth tier of devices 841 are not electrically separated, but rather share a common gate terminal. It can be appreciated that in other embodiments, any combination of sharing and/or separating of gate terminals can be utilized.

The second interconnect line 849 can be connected to devices in the fourth tier of devices 841, third tier of devices 839, second tier of devices 837 and/or first tier of devices 835 using top gate contacts. The first interconnect line 813 can be connected to devices in the first tier of devices 835 using bottom gate contacts.

Furthermore, the various device terminals can be altered to protrude (i.e. offset), providing a convenient opening for a connection between a device terminal and the first or second interconnect line. For example, as shown in the particular cross-sectional view of FIG. 3B, the gate terminals for the first tier of devices 835 and second tier of devices 837 have been laterally extended length-wise to protrude beyond the gate terminals of the third tier of devices 839 and fourth tier of devices 841, thereby enabling a portion of the top gate contacts 845 to connect the gate terminal of the second tier of devices 837 to the second interconnect line 849 in a direct path without touching the third tier of devices 839 and the fourth tier of devices 841. This lateral extension can be made possible by: (1) growing the gates of the first tier of devices 835 and the second tier of devices 837, (2) trimming down the gates of the third tier of devices 839 and fourth tier of devices 841, or (3) a combination thereof.

Figure 4:
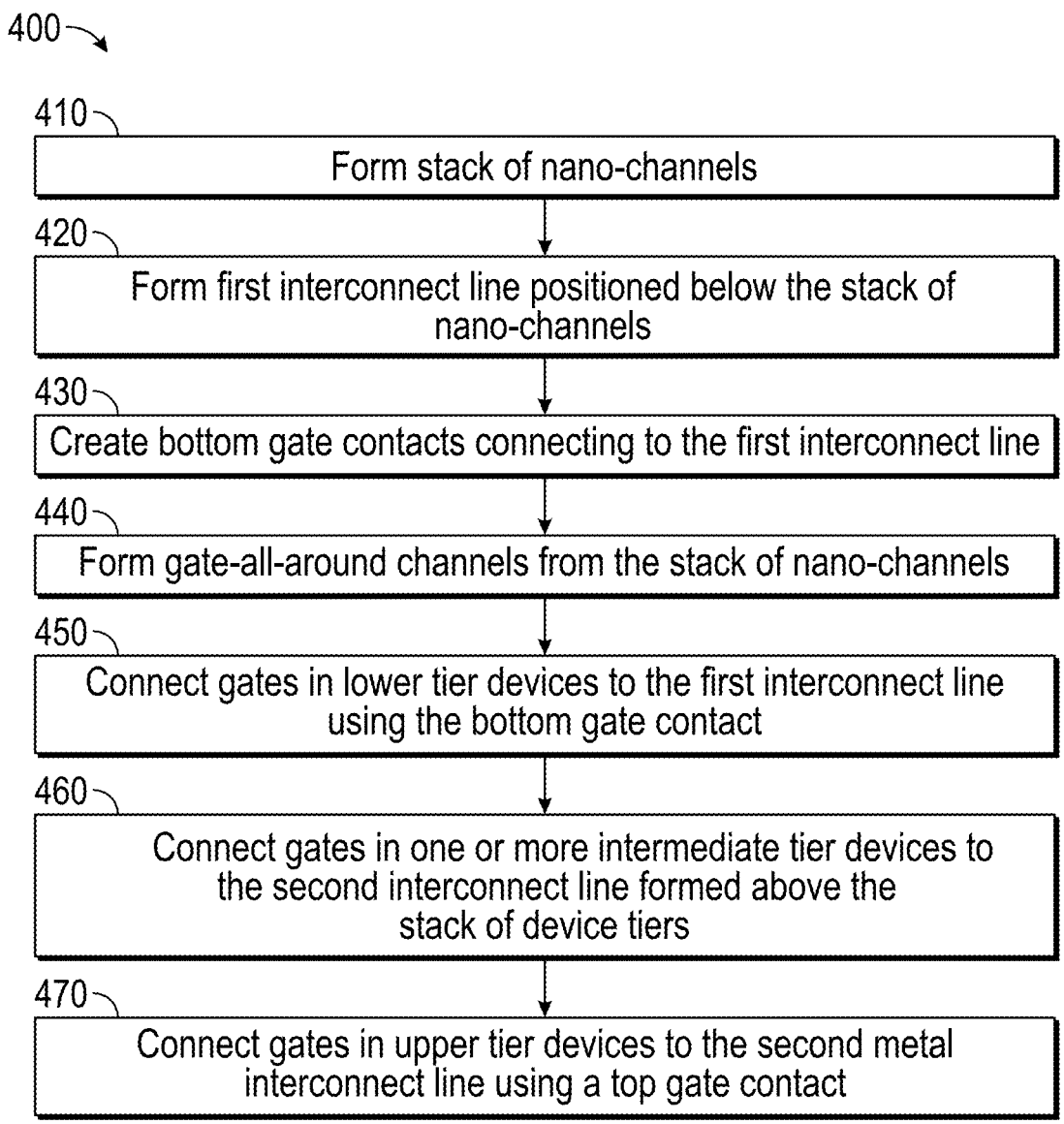
FIG. 4 is a flowchart of a method for creating a circuit having gate connections to a first interconnect line below a stack of devices using a bottom gate connect, and a second interconnect line above the stack of devices using a top gate contact, according to one embodiment of the present disclosure.

In one embodiment, it can be appreciated that the present disclosure can be viewed as a method. FIG. 4 is a flowchart outlining one embodiment of a method 400. Discussion of method 400 will be supplemented with exemplary process flow illustrations as shown in FIGS. 8A-8F, 9A-9F, 10A-10F, and 11A-11F, as well as reference to sub-methods of method 400 using FIGS. 5, 6 and 7.

Figure 8C:
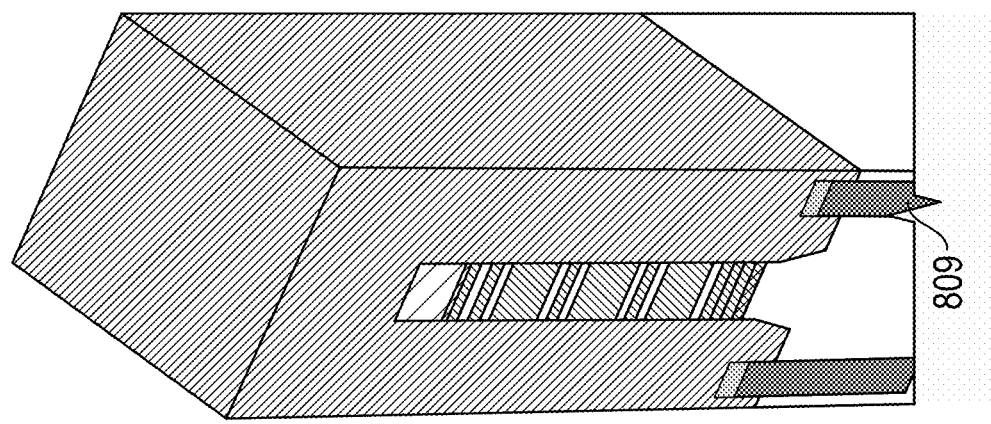
FIG. 8C illustrates buried power rail formation, according to one embodiment of the present disclosure.
Figure 8B:
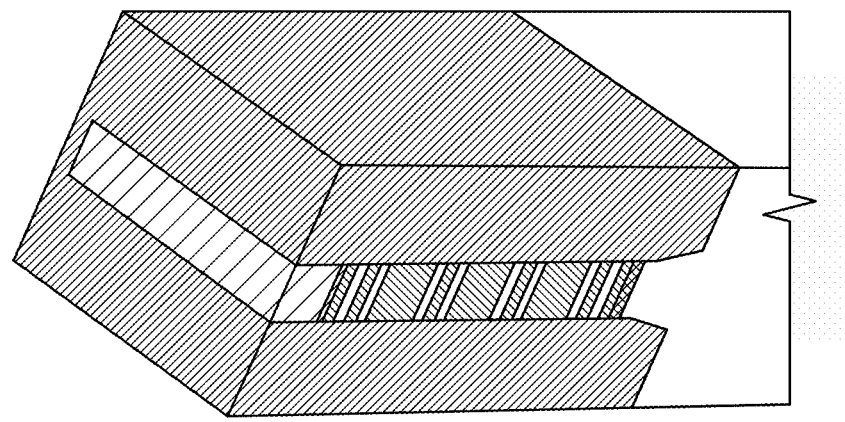
FIG. 8B illustrates active stack pattering, according to one embodiment of the present disclosure, according to one embodiment of the present disclosure.
Figure 8A:
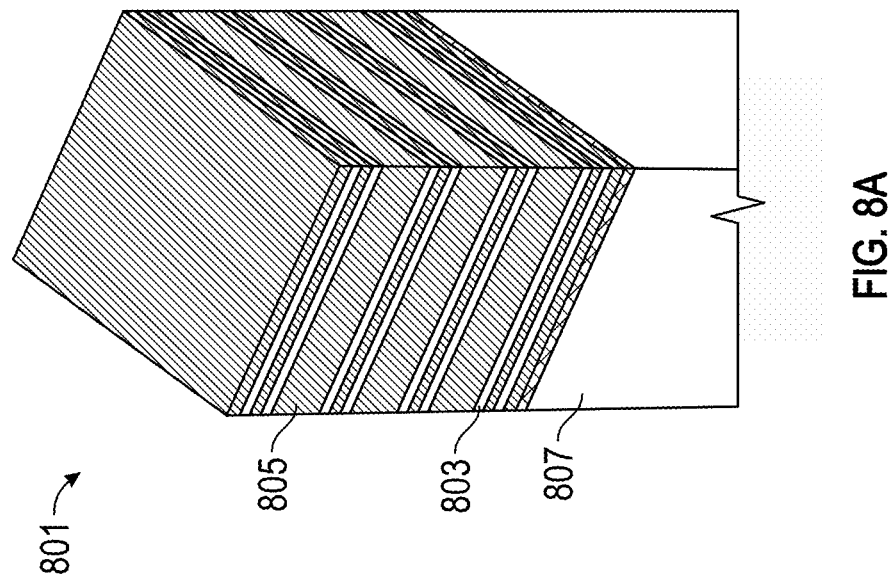
FIG. 8A illustrates active stack formation, according to one embodiment of the present disclosure, according to one embodiment of the present disclosure.

Step 410 is forming a stack of nano-channels spaced vertically from each other. An active layer stack can be formed, such as alternating layers of semiconductor material (e.g. Si, Ge, SiGe) grown epitaxially. An example of step 410 is shown in FIG. 8A, illustrating formation of an active stack 801 comprising silicon nano-channels 803 and sacrificial material 805 above bulk silicon 807.

Step 420 is forming a first interconnect line positioned below the stack of nano-channels. The first interconnect line is formed below the stack of nano-channels so that when the stack of nano-channels are later used to form a vertical stack of devices, device gates can be connected to the first interconnect line using a bottom gate contact. This allows gate connections to be made from below the stack, which in turn gives more space for gate connections to be made from the top of the stack.

Figure 5:
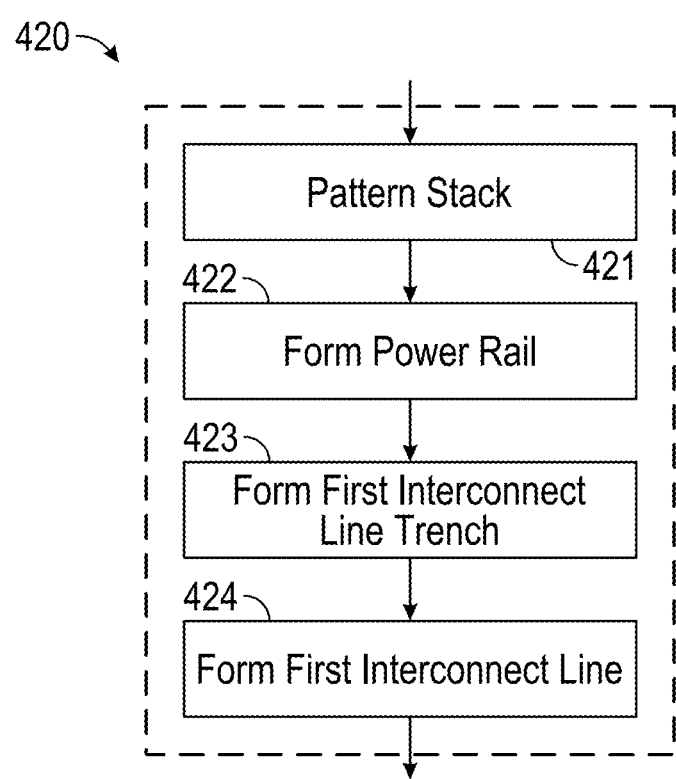
FIG. 5 is a flowchart of a method for forming a first interconnect line positioned below the stack of devices, according to one embodiment of the present disclosure.

FIG. 5 shows a flowchart of a sub-method for performing step 420. Step 421 is patterning the stack formed in step 410 by masking and etching the stack. For example, the patterning can form a fin structure having multiple sheets of alternating materials for nano-channels. An example of step 421 is shown in FIG. 8B, where the stack 801 has been masked and etched to form a fin structure having multiple sheets of alternating materials for the nano-channels 803.

Step 422 is forming a power rail. The power rail can be formed anywhere nearby (e.g. above, below, adjacent) the stack of nano-channels. In one embodiment, the power rail can be formed at least partially within bulk material below the stack. In another embodiment, this step can be omitted. An example of step 422 is shown in FIG. 8C, where a buried power rail 809 is formed at least partially in the bulk silicon 807 below the stack 801.

Figure 8F:
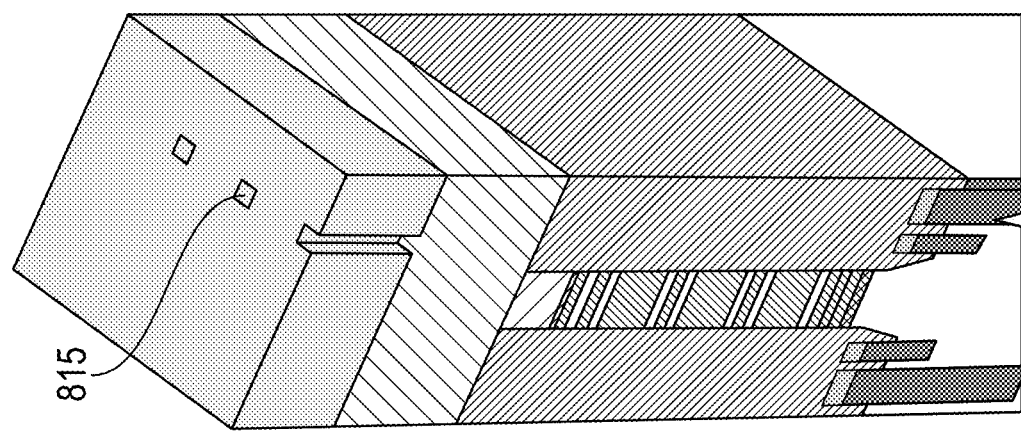
FIG. 8F illustrates bottom gate contact patterning, according to one embodiment of the present disclosure.
Figure 8E:
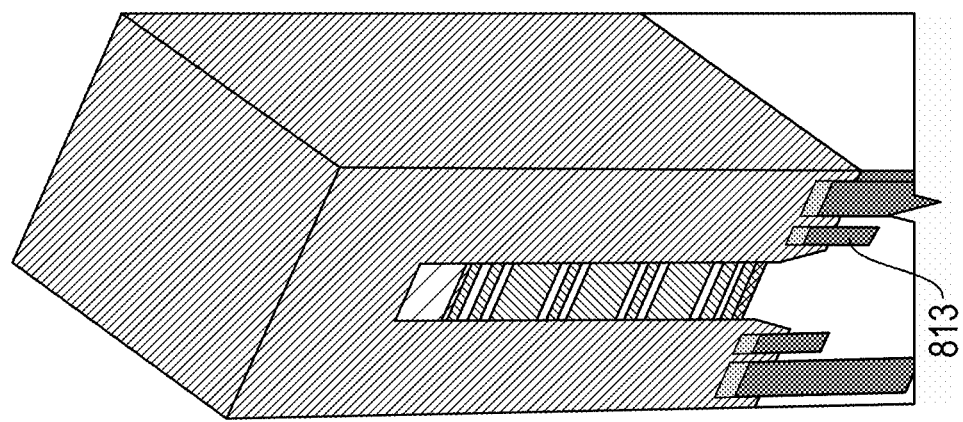
FIG. 8E illustrates buried interconnect formation, according to one embodiment of the present disclosure.
Figure 8D:
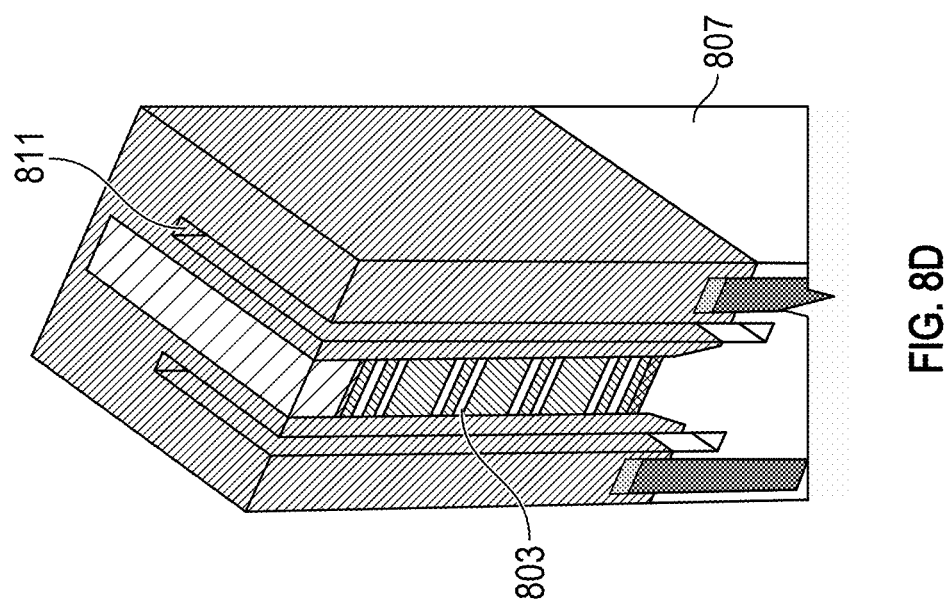
FIG. 8D illustrates buried interconnect trench formation, according to one embodiment of the present disclosure.

Step 423 is forming trenches for the first interconnect line. Trenches can be formed below and adjacent to (offset from) the nano-channels of the stack. The trenches can be formed at least partially within bulk material. An example of step 423 is shown in FIG. 8D, where trenches 811 are formed adjacent to the nano-channels 803 and partially within the bulk silicon 807.

Step 424 is forming the first interconnect line. The trenches formed in step 423 are metallized and thereby form the first interconnect line, to be later connected to gates of lower tier devices. Various metals can be used, such as ruthenium, which enables selective deposition to mitigate overburden to be removed. In addition, after the trench is filled, the metal can be capped, and a dielectric can be deposited on the substrate to fill openings above the first interconnect line used to create the trenches. An example of step 424 is shown in FIG. 8E, where the trenches 811 from FIG. 8D have been partially metallized and capped to form a first interconnect line 813, and a dielectric is deposited to fill the trenches 811 above the first interconnect line 813.

Returning back to FIG. 4, step 430 is creating bottom gate contacts that connect to the first interconnect line. The purpose of creating the bottom gate contact is to connect one or more gates of lower tier devices (formed later) to the first interconnect line formed in step 420.

Figure 6:
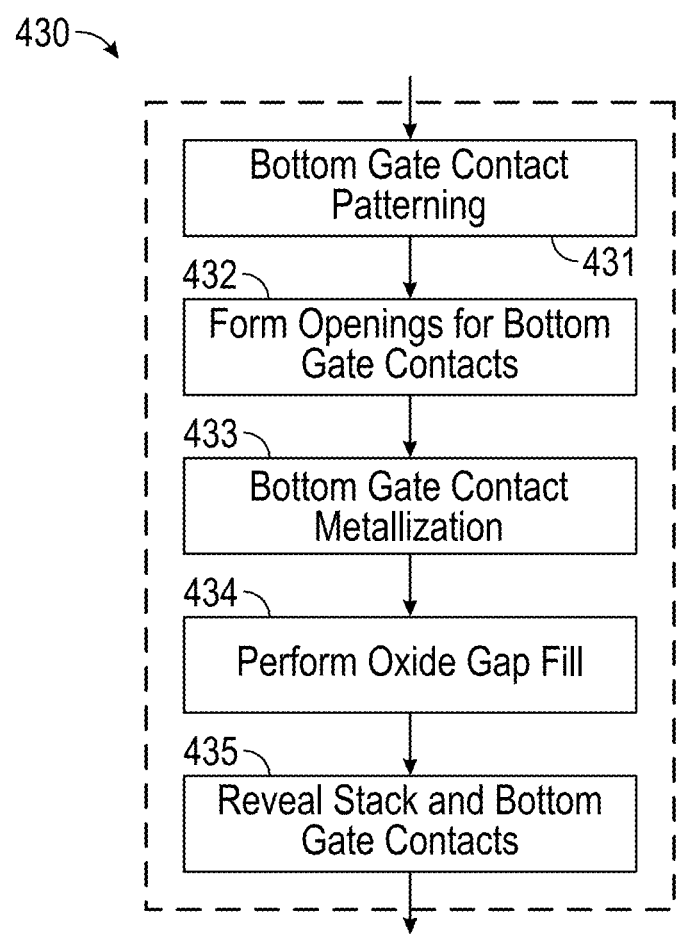
FIG. 6 is a flowchart of a method for creating bottom gate contacts, according to one embodiment of the present disclosure.

FIG. 6 shows a flowchart of a sub-method for performing step 430. Step 431 is bottom gate contact patterning. A pattern can be used for forming bottom gate contact openings. These are similar to vias that connect the first interconnect line to the bottom gates once they have been formed. An example of bottom gate contact patterning is shown in FIG. 8F, where a bottom gate contact pattern 815 is shown.

Figure 9C:
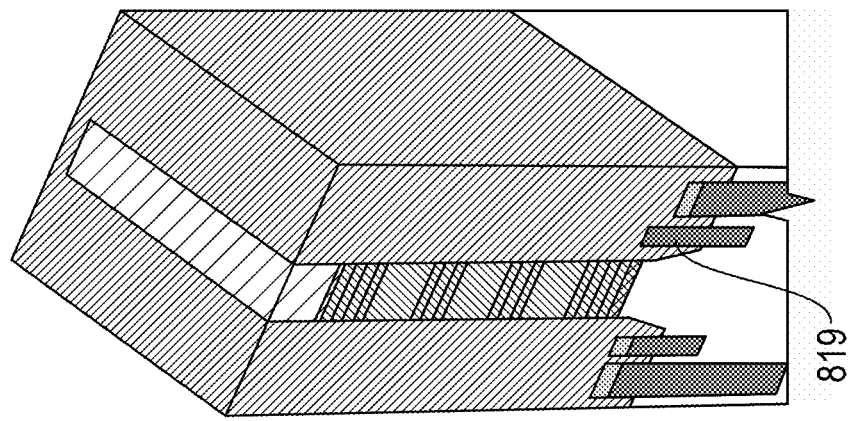
FIG. 9C illustrates an oxide gap fill, according to one embodiment of the present disclosure.
Figure 9B:
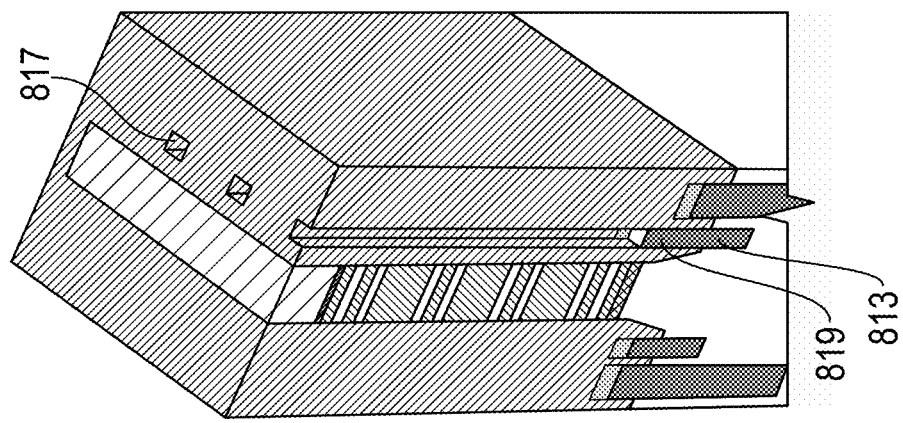
FIG. 9B illustrates bottom gate contact metallization, according to one embodiment of the present disclosure.
Figure 9A:
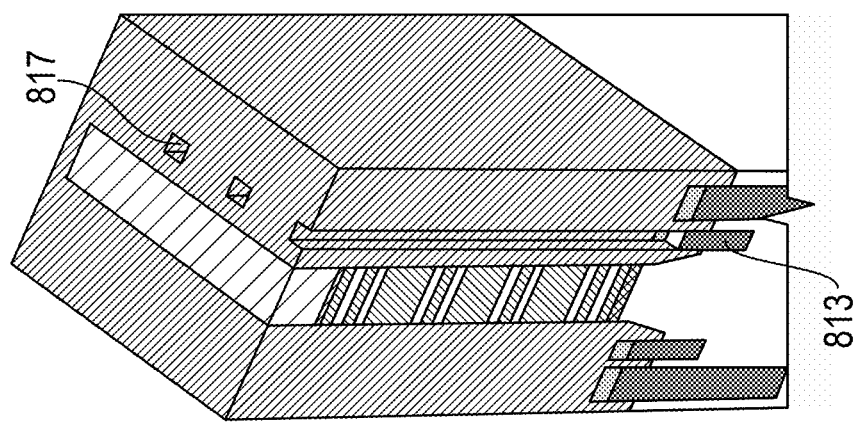
FIG. 9A illustrates a bottom gate contact oxide etch, according to one embodiment of the present disclosure.

Step 432 is forming openings for bottom gate contacts. In one embodiment, an oxide etch can be performed using the bottom gate contact pattern from step 431. An example of this step is shown in FIG. 9A, where openings 817 are etched and transferred to reflect the bottom gate contact pattern 815 from FIG. 8F. The openings 817 partially expose the first interconnect line 813.

Step 433 is bottom gate contact metallization. Bottom gate contact openings formed in step 432 are metallized, that is, a conductor is extended from the buried first interconnect line to one or more locations above the buried first interconnect line for later connection to gates in lower device tiers. An example is shown in FIG. 9B, where metal is partially formed in the openings 817 on the first interconnect line 813, thereby creating bottom gate contacts 819 extended above and connected to the first interconnect line 813.

Step 434 is performing an oxide gap fill, though in other embodiments, this step can be omitted. The openings above the newly formed bottom gate contacts can be filled with oxide. An example is shown in FIG. 9C, where remaining (non-metallized) portions of the openings 817 above the bottom gate contacts 819 from FIG. 9B have been filled with oxide.

Figure 9F:
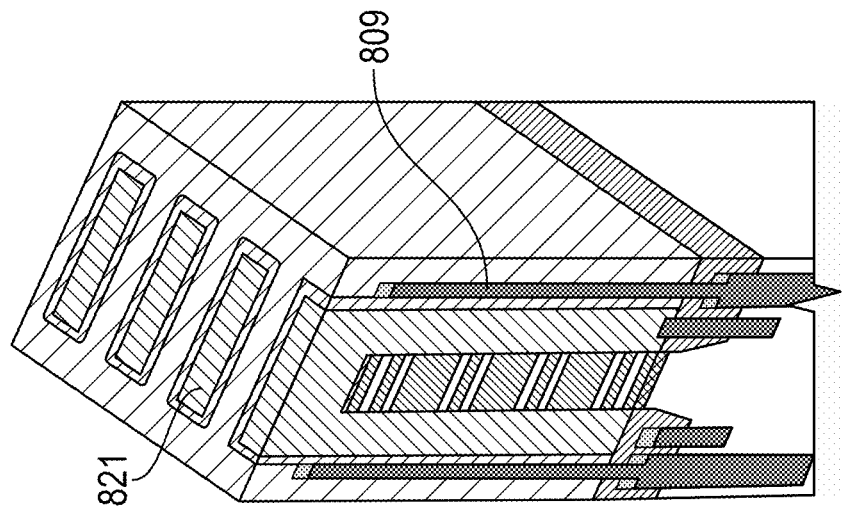
FIG. 9F illustrates surface planarization to open access to dummy gates, according to one embodiment of the present disclosure.
Figure 9E:
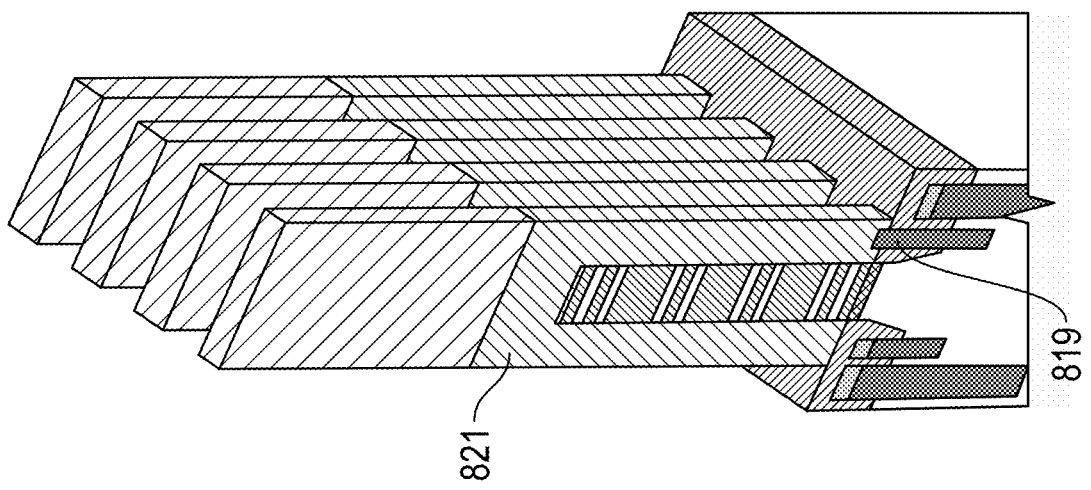
FIG. 9E illustrates dummy gate formation, according to one embodiment of the present disclosure.
Figure 9D:
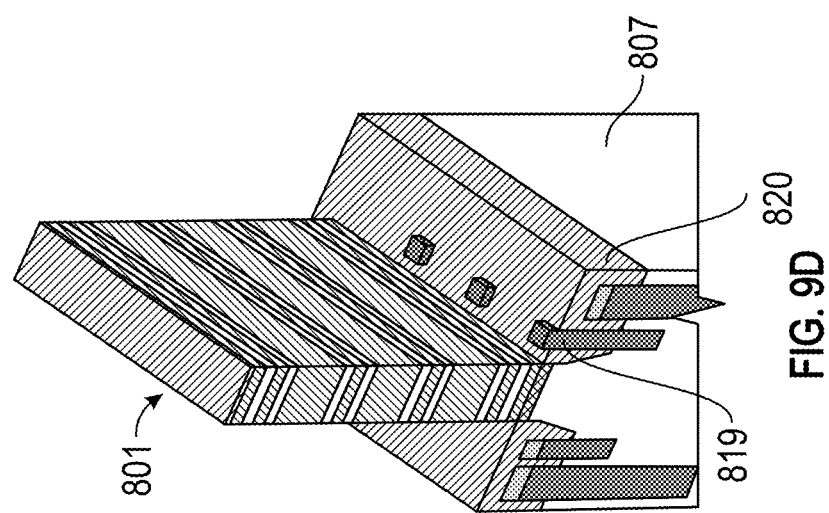
FIG. 9D illustrates revealing the active stack and bottom gate contact, according to one embodiment of the present disclosure.

Step 435 is revealing the active stack and bottom gate contacts. Oxide or dielectric is etched until uncovering the bottom gate contacts and the stack of nano-channels. This can be executed with an oxide recess etch, for example. The uncovered height of the bottom gate contacts can be approximately 5-20 nanometers according to one embodiment, though this height can vary in other embodiments. An example is shown in FIG. 9D, where the etching has been performed to reveal the stack 801 and bottom gate contacts 819, the bottom gate contacts 819 being partially exposed above the bulk silicon 807 and shallow trench isolation 820.

Referring back to FIG. 4, step 440 is forming gate-all-around channels from the stack of nano-channels. The gate-all-around channels can be used later as channels for devices of various tiers. As appreciated by one of skill in the art, the number of gate-all-around channels used for forming each tier of devices can vary.

Figure 7:
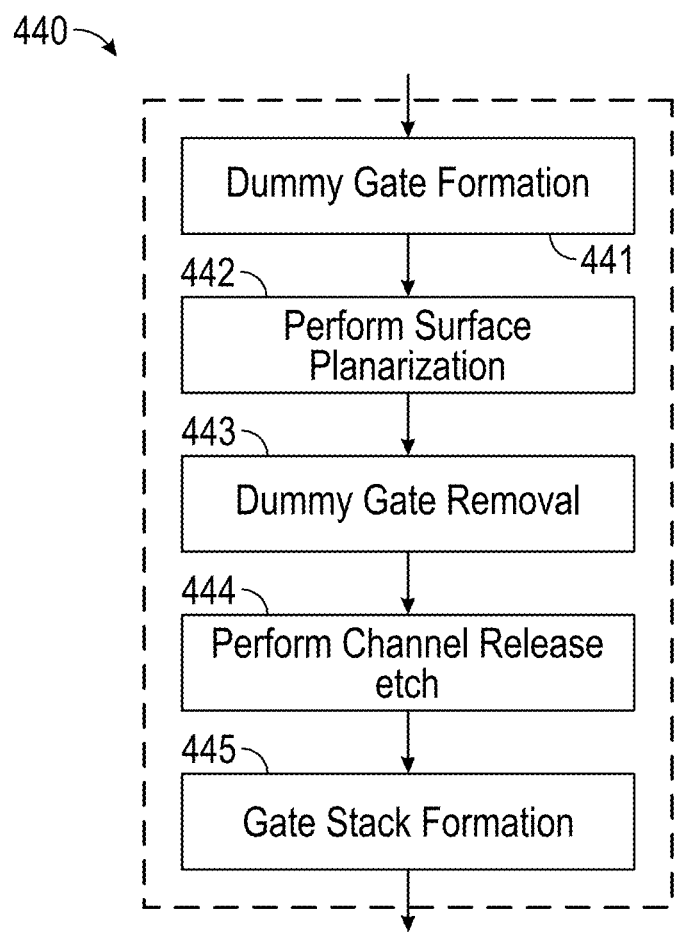
FIG. 7 is a flowchart of a method for forming gate-all-around channels, according to one embodiment of the present disclosure.

FIG. 7 shows a flowchart of a sub-method for performing step 440. Step 441 is dummy gate formation. For brevity, because dummy gate formation is not a new concept, detailed discussion is omitted. It can be appreciated that any technique known by one of skill in the art can be used for forming the dummy gates. The dummy gate material can be in direct contact with the revealed height of the bottom gate contacts. An example of step 441 is shown in FIG. 9E, where the dummy gates 821 are in contact with the bottom gate contacts 819.

Step 442 is performing surface planarization. With access to the dummy gate material, a conventional replacement metal gate (RMG) flow can be followed according to one embodiment. An example of step 442 is shown in FIG. 9F. FIG. 9F shows open access to the dummy gates 821 after surface planarization. In addition, note that the power rail 809 has been extended upwards, essentially creating a power wall. Note that formation of the power rail 809 can be omitted in other embodiments.

Step 443 is dummy gate removal. The RMG flow can include selectively removing dummy gate material using etch processes known by one of skill in the art. An example of step 443 is shown in FIG. 10A, where the dummy gates 821 from FIG. 9F have been selectively removed. Removal of the dummy gate material reveals again the top of the bottom gate contacts 819.

Step 444 is performing a channel release etch. Once the dummy gate material is selectively removed, a channel release etch is executed to remove the sacrificial material between nano-channels. In one embodiment, this selective, isotropic etch can be executed using vapor-phase etching, which is known to be able to target one semiconductor material while leaving other semiconductor materials. An example of step 444 is shown in FIG. 10B, where sacrificial material 805 is removed between the nano-channels 803, thereby exposing the silicon nano-channels 803.

Step 445 is gate stack formation for the different devices in the stack. The gate dielectric materials (interlayer (IL) and high-k (HK)) are deposited by selective deposition on the nano-channels only, without forming on the uncovered top of the bottom gate contacts. Thereafter, depending on the type of metallization selected for each of the metals needed for the gate stack, the uncovered top of the bottom gate contacts will be covered with all or only some of these metals. An example is shown in FIG. 10C, where gate stack formation has been executed, thereby creating four tiers of devices (one lower device tier, two intermediate device tiers, and one upper device tier), each device tier having two gate-all-around channels 823.

Figure 10C:
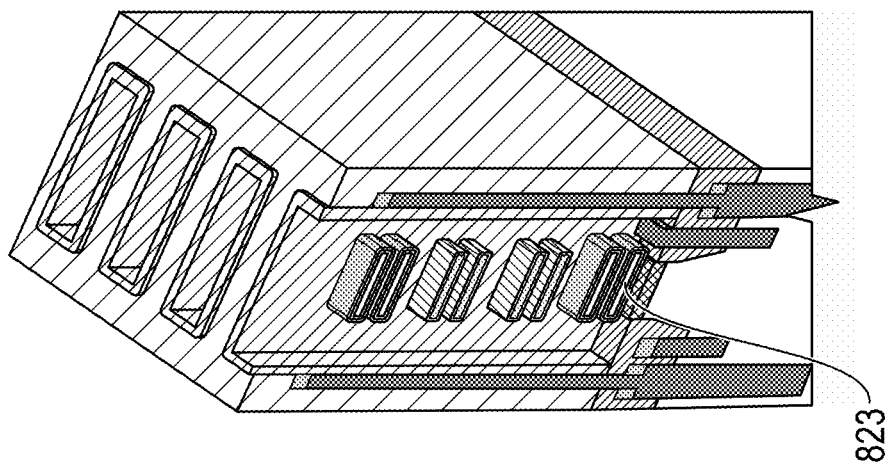
FIG. 10C illustrates gate stack formation, according to one embodiment of the present disclosure.
Figure 10B:
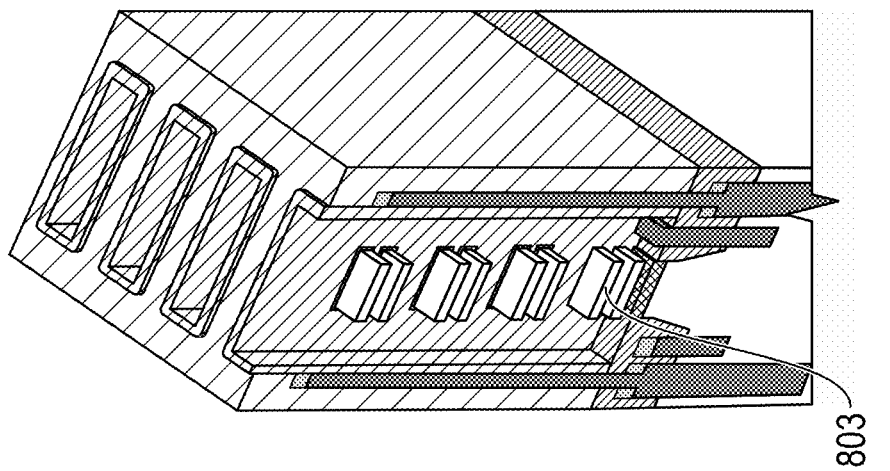
FIG. 10B illustrates a channel release, according to one embodiment of the present disclosure.
Figure 10A:
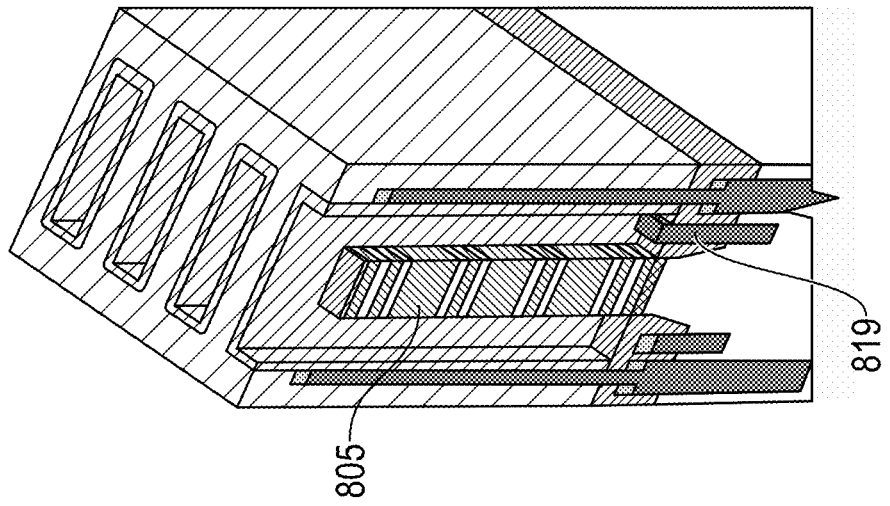
FIG. 10A illustrates dummy gate removal, according to one embodiment of the present disclosure.
Figure 11C:
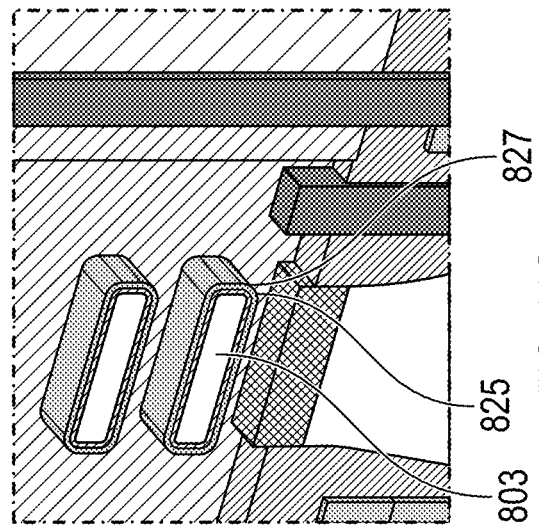
FIG. 11C shows a zoomed in view during interlayer (IL)/high-k (HK) formation, according to one embodiment of the present disclosure.
Figure 11B:
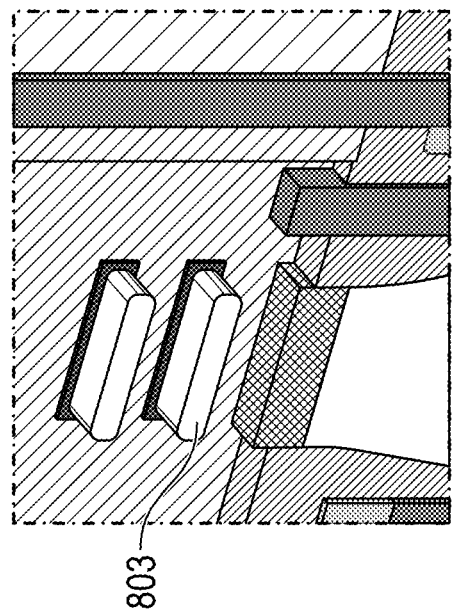
FIG. 11B shows a zoomed in view during channel releases, according to one embodiment of the present disclosure.
Figure 11A:
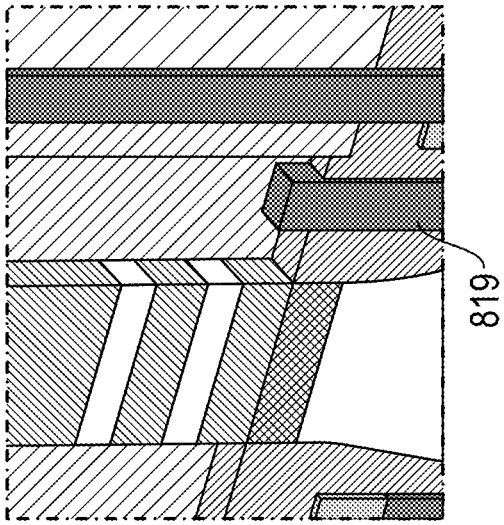
FIG. 11A shows a zoomed in view during dummy gate removal, according to one embodiment of the present disclosure.

FIG. 11A-11F show a zoomed in view of the revealed top of the bottom gate contact 819 in FIGS. 10A, 10B, and 10C during steps 443, 444, and 445. FIG. 11A shows a close up of the bottom gate contact 819 after dummy gate removal in step 443. As shown, the bottom gate contact 819 is partially exposed. FIG. 11B shows the same view after a channel release has been performed in step 444, thereby exposing the nano-channels 803. FIG. 11C shows IL 825 and HK 827 formed selectively on the silicon nano-channels 803. HK 827 is the outer layer relative to the IL 825.

FIG. 11D shows a first metal 829 (e.g. TiN, TaN, TiAl) deposited selectively only on the HK 827, and not covering the revealed top of the bottom gate contact 819 (though it would be fine if it did). FIG. 11E shows a second metal 831 (e.g. TiN, TaN, TiAl) deposited selectively on the first metal 829. This second metal 831 can cover the revealed top of the bottom gate contact 819. FIG. 11F shows a third metal 833 (e.g. TiN, TaN, TiAl) deposited selectively on the second metal 831, thereby completing gate stack formation.

It should be noted that if the liner (e.g. TiN) of the revealed top of the bottom gate contacts via is removed by an isotropic etch, leaving only the core metal exposed (e.g. Ru), then the number of metal interfaces on the revealed top of the bottom gate contacts can be limited.

Referring back to FIG. 4, step 450 is connecting one or more gates in the lower tier of devices to the first interconnect line using the bottom gate contact. This can include lower gate metallization, where gates of the lower tier devices are metallized with final metal, such as tungsten (W) or ruthenium (Ru). This final metal connects to the uncovered top of the bottom gate contacts, thereby establishing contact between the actual device gates in the lower tier devices and the first interconnect line through the uncovered top of the bottom gate contacts.

Step 460 is connecting one or more gates in the intermediate tier of devices to the second interconnect line formed above the stack of device tiers. In other words, metallized gates for devices vertically positioned between lower and upper tier devices can be connected to the second interconnect line located above the upper-most device tier. Connections to the second interconnect line can be made using conventional top gate contacts. In embodiments where there are no intermediate devices, this step can be omitted.

Step 470 is connecting one or more upper gates in the upper tier of devices to the second interconnect line using a top gate contact, thereby forming the final structure. Because some connections were made using the first interconnect line, there is more room for connections between gates of upper/intermediate tier devices and the second metal interconnect line. These connections can be made using conventional top gate contacts.

Figure 10F:
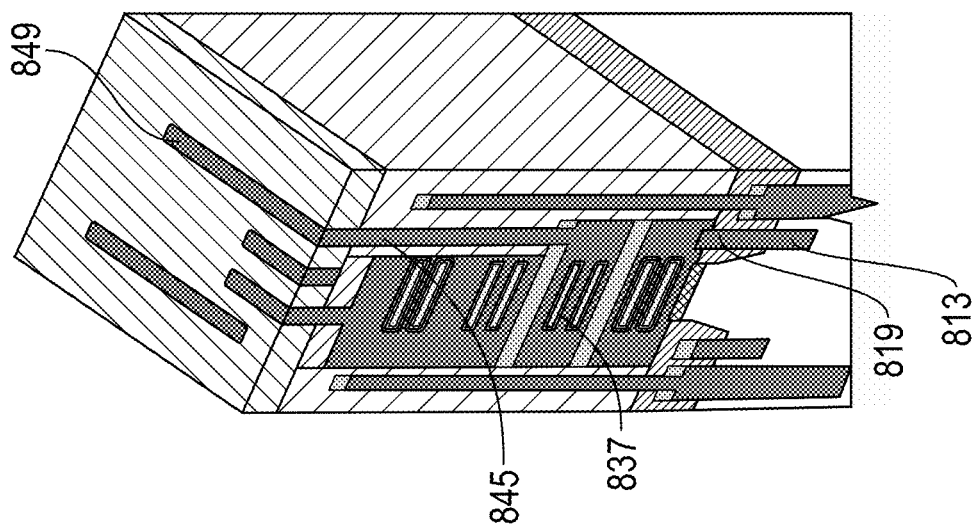
FIG. 10F illustrates a final structure, according to one embodiment of the present disclosure.
Figure 10E:
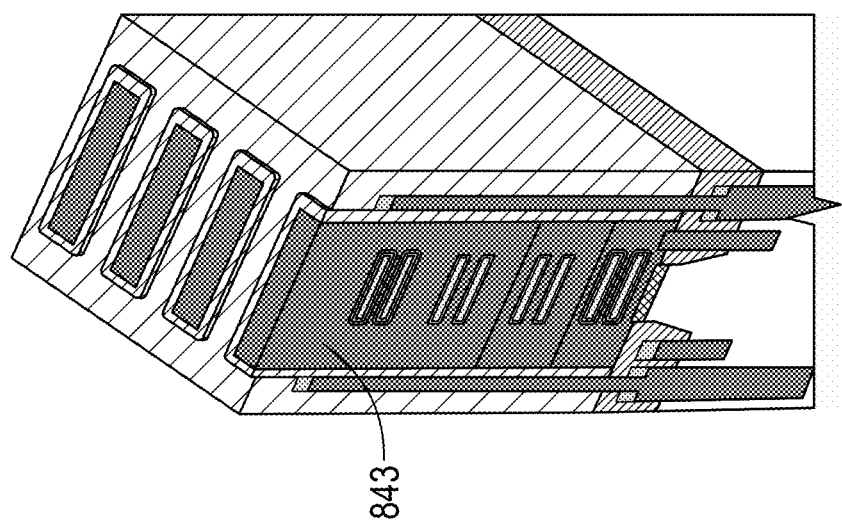
FIG. 10E illustrates final gate metallization of the tier 3 and tier 4 devices, according to one embodiment of the present disclosure.
Figure 10D:
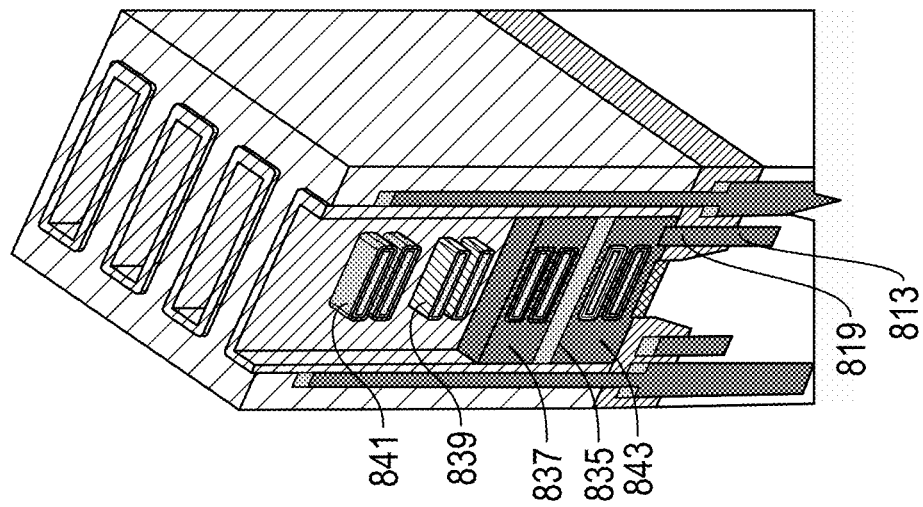
FIG. 10D illustrates final gate metallization of the tier 1 and tier 2 devices, according to one embodiment of the present disclosure.

An example of steps 450-470 are shown in FIG. 10D-10F. In FIG. 10D, the gate of a first tier of devices 835 and gate of a second tier of devices 837 have been metallized with a final metal 843 (e.g. W, Ru). Some of this final metal 843 connects to the uncovered top of the bottom gate contacts 819, thus establishing contact between the actual device gate of the first tier of devices 835 and the first interconnect line 813 through the uncovered top of the bottom gate contacts 819. In FIG. 10E, final metallization has been executed for the third tier of devices 839 and the fourth tier of devices 841. The final structure is shown in FIG. 10F. One of the top gate contacts 845 is connecting the gate of the second tier of devices 837 and the second interconnect line 849, while one of the bottom gate contacts 819 connecting the gate of the first tier of devices 835 and the first interconnect line 813.

As can be appreciated, many different combinations of gate contacts can be formed to various tiers from either top or buried interconnects in other embodiments.

In one embodiment, the bottom gate contacts in step 433 are initially formed with a sacrificial material instead of metal. This sacrificial material is then uncovered in step 443 during dummy gate removal. The sacrificial material is then selectively removed before the IL/HK selective formation.

Alternatively, this sacrificial material can be the same material as the dummy gate material, and be removed together with the dummy gate in step 443. The bottom gate contacts then receive final metallization during gate stack metal deposition.

In one embodiment, back side processing can be utilized. For example, the bottom gate contacts can be printed directly from a back side of the wafer, or the buried interconnects and the bottom gate contacts can be printed together from a back side of the wafer in a dual damascene technique. As another example, the bottom gate contacts and buried interconnects can be printed on the front side of the wafer and filled with sacrificial material. The bottom gate contacts and buried interconnects can then be revealed during backside processing. The sacrificial material can be removed from both buried interconnect and bottom gate contacts, then metallized together, akin to a dual damascene approach. In another embodiment, the bottom gate contacts can be printed directly through the dummy gate cavity after dummy gate removal in step 443.

It can be appreciated that the present disclosure can also be viewed as system. In one embodiment, the system is a semiconductor device comprising: a stack of device tiers having at least three device tiers including a lower device tier, one or more intermediate device tiers stacked vertically over the lower device tier, and an upper device tier stacked vertically over the intermediate device tiers, each device tier having at least one lateral gate-all-around channel of a field effect transistor; a first interconnect line positioned below the stack of device tiers; a second interconnect line positioned above the stack of device tiers; a bottom contact that connects the first interconnect line to one or more first device terminals from the stack of device tiers; and a top contact that connects the second interconnect line to one or more second device terminals from the stack of device tiers. Exemplary systems are represented in FIGS. 3A, 3B, and 10F, which were previously discussed.

As previously discussed, the system can be viewed in many embodiments. For example, an intermediate device terminal in the one or more intermediate device tiers can be connected to the second interconnect line.

In another embodiment, the system includes a power rail. The power rail can provide power to the stack of device tiers, and be positioned in a myriad of locations, such as above the stack of device tiers, below the stack of device tiers, or next to the stack of device tiers.

In one embodiment, the device terminals connected to the top and/or bottom contact is a gate. In other embodiments, the device terminals connected to the top and/or bottom contact is a source or drain.

Those skilled in the art will also understand that there can be many variations made to the operations of the techniques explained above while still achieving the same objectives of the invention. Such variations are intended to be covered by the scope of this disclosure. The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. As such, the foregoing descriptions of embodiments of the invention are not intended to be limiting. Rather, any limitations to embodiments of the invention are presented in the following claims.

Embodiments of the present disclosure may also be as set forth in the following parentheticals.

(1) A semiconductor device comprising: a stack of device tiers having at least three device tiers including a lower device tier, one or more intermediate device tiers stacked vertically over the lower device tier, and an upper device tier stacked vertically over the intermediate device tiers, each device tier having at least one lateral gate-all-around channel of a field effect transistor; a first interconnect line positioned below the stack of device tiers; a second interconnect line positioned above the stack of device tiers; a bottom contact that connects the first interconnect line to one or more first device terminals from the stack of device tiers; and a top contact that connects the second interconnect line to one or more second device terminals from the stack of device tiers.

(2) The semiconductor device of (1), wherein the one or more first device terminals is a lower device terminal in the lower device tier.

(3) The semiconductor device of any (1) to (2), wherein the one or more first device terminals and the one or more second devices terminals is a gate. (4) The semiconductor device of any (1) to (3), wherein the one or more second device terminals is at least one of an upper device terminal in the upper device tier and an intermediate device terminal in the one or more intermediate device tiers.

(5) The semiconductor device of any (1) to (4), wherein, in a case that the one or more second device terminals includes the intermediate device terminal, the intermediate device terminal is laterally extended beyond a length of (1) the upper device terminal and (2) any additional intermediate device terminals from the one or more intermediate device tiers located above the intermediate device terminal to connect the top contact to the intermediate device terminal without contacting the additional intermediate device terminals nor the upper device terminal.

(6) The semiconductor device of any (1) to (5), wherein at least one of vertically adjacent device tiers in the stack of device tiers shares a common device terminal.

(7) The semiconductor device of any (1) to (6), further comprising insulation material located between and electrically separating device terminals of at least one pair of vertically adjacent device tiers in the stack of device tiers.

(8) The semiconductor device of any (1) to (7), further comprising a power rail positioned to provide power to the stack of device tiers.

(9) The semiconductor device of any (1) to (8), wherein the one or more first device terminals and the one or more second device terminals is at least one of a source and drain.

(10) A method of forming a semiconductor device, the method comprising: forming a stack of nano-channels spaced vertically from each other; forming a first interconnect line positioned below the stack of nano-channels; creating a bottom contact that connects to the first interconnect line; forming gate-all-around channels from the stack of nano-channels, wherein the gate-all-around channels form a stack of device tiers having at least three device tiers including a lower device tier, one or more intermediate device tiers stacked vertically over the lower device tier, and an upper device tier stacked vertically over the one or more intermediate device tiers; connecting the first interconnect line to one or more first device terminals from the stack of device tiers using the bottom contact; and connecting a second interconnect line to one or more second device terminals from the stack of device tiers using a top contact, the second interconnect line formed above the stack of device tiers.

(11) The method of (10), wherein the one or more first device terminals is a lower device terminal in the lower device tier.

(12) The method of any (10) to (11), wherein the one or more first device terminals and the one or more second device terminals is a gate.

(13) The method of any (10) to (12), wherein the one or more second device terminals is at least one of an upper device terminal in the upper device tier and an intermediate device terminal in the one or more intermediate device tiers.

(14) The method of any (10) to (13), further comprising, in a case that the one or more second device terminals includes the intermediate device terminal, laterally extending the intermediate device terminal beyond a length of (1) the upper device terminal and (2) any additional intermediate device terminals from the one or more intermediate device tiers located above the intermediate device terminal to connect the top contact to the intermediate device terminal without contacting the additional intermediate device terminals nor the upper device terminal.

(15) The method of any (10) to (14), further comprising forming a power rail positioned to provide power to the stack of device tiers.

(16) The method of any (10) to (15), wherein the creating the bottom contact includes forming a pattern of the bottom contact, filling the pattern with sacrificial material, and replacing the sacrificial material with metal.

(17) The method of any (10) to (16), wherein the forming the first interconnect includes forming a pattern of the first interconnect, filling the pattern with sacrificial material, and replacing the sacrificial material with metal.

(18) The method of any (10) to (17), wherein the one or more first device terminals and the one or more second device terminals is at least one of a source and drain.

(19) The method of any (10) to (18), wherein at least one of vertically adjacent device tiers in the stack of device tiers shares a common device terminal.

(20) The method of any (10) to (19), further comprising electrically separating device terminals of at least one of vertically adjacent device tiers in the stack of device tiers using insulation material.

The invention claimed is:

1. A semiconductor device comprising:
a stack of device tiers having at least three device tiers including a lower device tier, one or more intermediate device tiers stacked vertically over the lower device tier, and an upper device tier stacked vertically over the intermediate device tiers, each device tier having at least one lateral gate-all-around channel of a field effect transistor;
a first interconnect line positioned below the stack of device tiers;
a second interconnect line positioned above the stack of device tiers;
a bottom contact that connects the first interconnect line to one or more first device terminals from the stack of device tiers; and
a top contact that connects the second interconnect line to one or more second device terminals from the stack of device tiers,
wherein the one or more second device terminals includes an intermediate device terminal of a first intermediate device tier in the one or more intermediate device tiers, the upper device tier and any second intermediate device tier in the one or more intermediate device tiers above the first intermediate device tier are offset a distance from any third intermediate device tier in the one or more intermediate device tiers below the first intermediate device tier and the lower device tier such that the intermediate device terminal is laterally extended beyond a length of the upper device terminal and the second intermediate device tier to connect the top contact to the intermediate device terminal without contacting the second intermediate device tier nor the upper device tier.

2. The semiconductor device of claim 1, wherein the one or more first device terminals is a lower device terminal in the lower device tier.

3. The semiconductor device of claim 1, wherein the one or more first device terminals and the one or more second device terminals is a gate.

4. The semiconductor device of claim 1, wherein at least one of vertically adjacent device tiers in the stack of device tiers shares a common device terminal.

5. The semiconductor device of claim 1, further comprising insulation material located between and electrically separating device terminals of at least one pair of vertically adjacent device tiers in the stack of device tiers.

6. The semiconductor device of claim 1, further comprising a power rail positioned to provide power to the stack of device tiers.

7. The semiconductor device of claim 1, wherein the one or more first device terminals and the one or more second device terminals is at least one of a source and drain.

* * * * *

UNITED STATES PATENT AND TRADEMARK OFFICE
CERTIFICATE OF CORRECTION

PATENT NO. : 11,646,318 B2  
APPLICATION NO. : 17/326449  
DATED : May 9, 2023  
INVENTOR(S) : Chanemougame et al.

Page 1 of 1

It is certified that error appears in the above-identified patent and that said Letters Patent is hereby corrected as shown below:

On the Title Page

Column 1, Item (72), in "Inventors", Line 3, delete "Mechanicsville," and insert -- Mechanicville, --, therefor.

Signed and Sealed this  
Fifth Day of December, 2023

Katherine Kelly Vidal  
*Director of the United States Patent and Trademark Office*